United States Patent [19]

Danilin et al.

[11] 4,158,103

[45] Jun. 12, 1979

[54] ELECTRIC WOVEN SWITCHING MATRIX

[76] Inventors: Jury I. Danilin, ulitsa Savushkina, 9, kv. 64; Konstantin A. Maringulov, ulitsa Lomonosova, 12, kv. 68; Leonid A. Voronkov, Lesnoi prospekt, 32, kv. 105; Mikhail N. Mokeev, prospekt Schorsa, 64, kv. 31; Anatoly M. Khripov, ulitsa Tipanova, 29, kv. 1003, all of Leningrad, U.S.S.R.

[21] Appl. No.: 787,328

[22] Filed: Apr. 14, 1977

[30] Foreign Application Priority Data

Apr. 19, 1976 [SU] U.S.S.R. .......................... 2349069[I]

[51] Int. Cl.² ............................................ H05K 1/04
[52] U.S. Cl. ................. 174/68.5; 139/425 R; 174/117 M; 361/417
[58] Field of Search ............ 174/72 TR, 117 M, 68.5; 361/410, 416, 417, 419; 139/425 R

[56] References Cited

U.S. PATENT DOCUMENTS

| | | | |
|---|---|---|---|
| 3,631,298 | 12/1971 | Davis | 174/117 M X |
| 3,711,627 | 1/1973 | Maringulov | 174/68.5 |

FOREIGN PATENT DOCUMENTS 2532908  2/1976  Fed. Rep. of Germany ...... 174/117 M

*Primary Examiner*—Laramie E. Askin
*Attorney, Agent, or Firm*—Lackenbach, Lilling & Siegel

[57] ABSTRACT

An electric woven switching matrix comprises an insulating field fabric made by interweaving insulating fibers, conducting wires interwoven into the insulating field fabric, and sections for installation of circuit elements over the matrix area. The conducting wires, passing through these sections and intended for forming, by cutting, matrix contact terminals to be electrically connected with the lead-outs of the circuit elements installed on the matrix, extend out from the insulating field fabric, extend over the surface of a respective section and extend back into the insulating field fabric. Exit points from the insulating field fabric and entrance points into the insulating field fabric for odd sets of conducting wires are staggered with respect to exit points from the insulating field fabric and entrance points into the insulating field fabric for even sets of conducting wires.

2 Claims, 4 Drawing Figures

ELECTRIC WOVEN SWITCHING MATRIX

FIELD OF THE INVENTION

The present invention relates to electric switching devices and, more particularly, to electric woven switching matrices. The invention can be widely used in a variety of electric and electronic systems to provide electrical interconnections between circuit elements located over the matrix area.

The invention can be used most successfully in modules with point-to-point wiring.

It is preferable to use the present invention in combination with the electric woven switching matrices described in U.S. Pat. No. 3,711,627.

In recent years electric woven switching matrices have won wide acceptance in a variety of electric and electronic systems incorporating a plurality of interconnected circuit elements. Woven matrices can be substituted successfully for multilayer printed and point-to-point wirings due to a number of inherent advantages including low fabrication cost, adaptablility to automation in fabrication, and capability of providing interconnecting circuitry for a large number of circuit elements installed with a high circuit element density.

While the matrix itself is fabricated automatically by a loom which is controlled by a punch-card program, providing the required electrical interconnections of conducting wires in accordance with the electric circuit diagram of a particular device, the fabrication of contact terminals over the matrix area for connection with lead-outs of the circuit elements installed on it is a labor-consuming manual operation which leads to excessive time consumption when the matrix is manufactured and, hence, to an increase in its cost.

DESCRIPTION OF THE PRIOR ART

Known in the art is an electric woven switching matrix comprising an insulating field fabric formed by interweaving insulating fibers and non-insulated conducting wires disposed in two mutually perpendicular directions and interwoven into the insulating field fabric. The insulating fibers are arranged so as to provide insulation for adjacent conducting wires except at the nodal points where electrical connections of the crossing conducting wires are to be made.

The matrix has sections for installation of circuit elements. In each of these sections, a plurality of conducting wires, extending in one direction and intended for forming matrix contact terminals to be connected with circuit element lead-outs, extend out from the insulating field fabric, extend along the surface of a respective section for a certain distance determined by the required matrix contact terminal lengths and then extend back into the insulating fabric. Both the exit points of said plurality of conducting wires from the insulating field fabric and the entrance points into the insulating field fabric are aligned. Prior to installation of the circuit elements on the matrix, the conducting wires are severed in the center and bent so as to be electrically connected with the circuit element lead-outs. The length of the contact terminals formed in such a manner is equal to the half-length (or half-width) of the section intended for circuit element installation.

Relatively long matrix contact terminals are required for installation of certain circuit elements on the matrix. In such cases the area of sections occupied by the circuit elements should be increased, thus resulting in an increase in the total matrix area and in a decrease in the circuit element density. In order to obtain a higher circuit element density over the matrix area for a given length of its contact terminals, the conducting wires should be severed at their exit points from the insulating field fabric and at their entrance points into the insulating field fabric alternately, i.e. the odd conducting wires should be severed along one side of the section intended for circuit element installation, while the even conducting wires should be severed along the other side of this section. Such selective severances of conducting wires are labor-consuming operations which increase the matrix cost. Moreover, errors are very probable when selective severances are made.

SUMMARY OF THE INVENTION

It is an object of the present invention to provide an electric woven switching matrix which will require less labor for its fabrication due to the simplification of the operations for forming the contact terminals intended for electrical connection with the lead-outs of circuit elements to be installed on the matrix, while maintaining a given circuit element density over the matrix area.

Another object of the invention is to improve electric woven matrices of a known type.

With these and other objects in view, there is proposed an electric woven switching matrix comprising an insulating field fabric made by interweaving insulating fibers, conducting wires interwoven into the insulating field fabric, and sections for installation of circuit elements over the matrix area. The conducting wires, passing along these sections and cut to form matrix contact terminals to be electrically connected with the lead-outs of the circuit elements installed on the matrix, extend out from the insulating field fabric, extend over the surface of a respective section and extend back into the insulating field fabric. In accordance with the invention, the odd sets of conducting wires have their exit points from the insulating field fabric and their entrance points into the insulating field fabric staggered with respect to those for the even sets of conducting wires.

An advantage of the proposed invention is that, as a result of staggering the exit points of the conducting wires from the insulating field fabric and staggering their entrance points into the insulating field fabric, the matrix contact terminal forming operation is simplified while their required length is ensured, since the manual selection operation is eliminated for the odd and even sets of conducting wires. In the proposed matrix the conducting wires are severed along a line which passes between the exit points of the odd and even sets of conducting wires from the insulating field fabric as well as along a line passing between the entrance points of these conducting wires into the insulating field fabric. In this case, for example, all odd sets of conducting wires are severed along one side of the section for circuit element installation, while all even sets of conducting wires are severed along the other side of this section.

BRIEF DESCRIPTION OF THE DRAWINGS

These and other objects and advantages of the present invention will be better understood from the following description taken in conjunction with the accompanying drawings illustrating a preferred embodiment of the invention, wherein.

Detailed Description of the Invention

Figure 1:
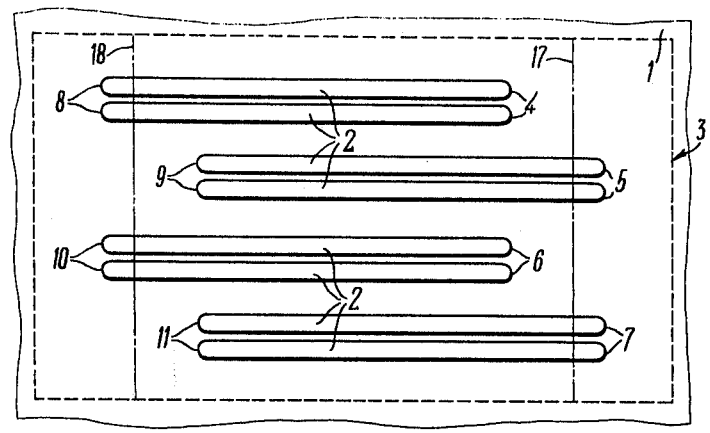
FIG. 1 is a plan view showing an electric woven switching matrix which has a section for installation of a circuit element with lead-outs arranged along two sides, in accordance with the invention.

Referring now to FIG. 1, an electric woven switching matrix, in accordance with the invention, comprises an insulating field fabric 1, made by interweaving insulating fibers, and conducting wires 2 interwoven into the insulating field fabric 1. The conducting wires 2 are arranged in sets with each set comprising two conducting wires 2. The structure of the insulating field fabric 1 with the conducting wires 2 interwoven into it is described, in U.S. Pat. No. 3711627. A section 3 for installation of a circuit element on the matrix is included. Though only one section 3 is shown in FIG. 1, it must be understood that a plurality of such sections 3 are disposed over the matrix area, their number corresponding to the number of circuit elements to be installed on the matrix. The area of each of the sections 3 is determined by the size of the circuit element to be installed on it. The conducting wires 2 extend out from the insulating field fabric 1 at points 4, 5, 6, and 7 on one side of the section 3, extend over the surface of the insulating field fabric 1 within the section 3 and then extend back into the insulating field fabric 1 at points 8, 9, 10, and 11 on the opposite side of the section 3. The exit and entrance points from and into the insulating field fabric 1 of alternate sets of wires 2 are staggered. As seen from FIG. 1, the exit points 4 and 6 of the odd sets of conducting wires 2 from the insulating field fabric 1 are staggered with respect to the exit points 5 and 7 of the even sets of conducting wires 2 from the insulating field fabric 1. Similarly, the entrance points 8 and 10 of the odd sets of conducting wires 2 into the insulating field fabric 1 are staggered with respect to the entrance points 9 and 11 of the even sets of conducting wires 2 into the insulating field fabric 1 by the same distance as their exit points 4, 5, 6 and 7 are staggered but in the opposite direction so that the lengths of the odd and even sets of conducting wires 2 passing along the section 3 are equal.

The words "odd" and "even" are used here to provide a convenient explanation of the invention and are not intend to be a limitation.

The conducting wires 2 extending over the surface of the insulating field fabric 1 are intended to form matrix contact terminals to be connected to the lead-outs of a circuit element installed in the section 3. In this case, it is supposed that a circuit element with lead-outs arranged along two sides is installed in the section 3. The lengths of the conducting wires 2 in the section 3 are determined by the required matrix terminal lengths.

Figure 2:
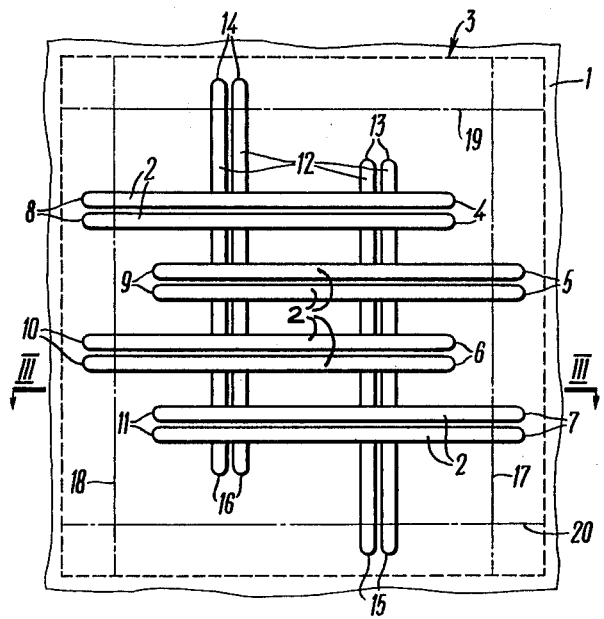
FIG. 2 is a plan view showing an electric woven switching matrix, according to the invention, which has a section for installation of a circuit element with lead-outs arranged along four sides.

FIG. 2 shows an electric woven switching matrix where conducting wires 12, extending at right angles to the direction of the conducting wires 2, are interwoven into the insulating field fabric 1 in addition to the conducting wires 2. In such a case, the section 3 is intended for installation of a circuit element with its lead-outs arranged along its four sides. In this case, the matrix contact terminals are formed by both the conducting wires 2 and the conducting wires 12. The arrangement of the conducting wires 12 in the section 3 is similar to that of the conducting wires 2 in the same section, viz. the conducting wires 12 extend out from the insulating field fabric 1 at exit point 13 and 14, extend in the section 3 over the surface of the insulating field fabric 1 and extend back into the insulating field fabric 1 at entrance points 15 and 16. The points 13 and 14 are displaced with respect to each other and the points 15 and 16 are displaced with respect to each other, just as are the ends of the wires 2, so that the lengths of the conducting wires 12 passing over the surface of the insulating field fabric 1 are equal.

Figure 3:
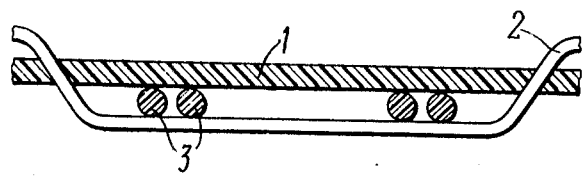
FIG. 3 is a cross sectional view taken along the line III—III of FIG. 2.

FIG. 3 is a sectional view of the matrix shown in FIG. 2 showing the section 3 for installation of a circuit element.

Prior to installation of a circuit element in the section 3 (FIG. 1), the conducting wires 2 are severed along a line 17 extending between the exit points 4 and 6 of the odd sets of conducting wires 2 from the insulating field fabric 1 and the exit points 5 and 7 of the even sets of conducting wires 2 from the insulating field fabric 1 and along a line 18 extending between the entrance points 8 and 10 of the odd sets of conducting wires 2 into the insulating field fabric 1 and the entrance points 9 and 11 of the even sets of conducting wires 2 into the insulating field fabric 1. The severance of the conducting wires is accomplished along each of the lines 17 and 18 simultaneously without their preselection from the entire arrangement of the conducting wires 2. Only the odd sets or only the even sets of conducting wires 2 are severed on each side of the section 3. The lines 17 and 18 may be indicated by colored fibers interwoven in the insulating field fabric 1 to facilitate the identification of the severance places of the conducting wires 2.

According to the embodiment of the section 3 shown in FIG. 2, the severance of the conducting wires 12 is additionally accomplished along lines 19 and 20 disposed, respectively, between the exit points 13 and 14 of the conducting wires 12 from the insulating field fabric 1 and the entrance points 15 and 16 into the insulating field fabric 1.

Figure 4:
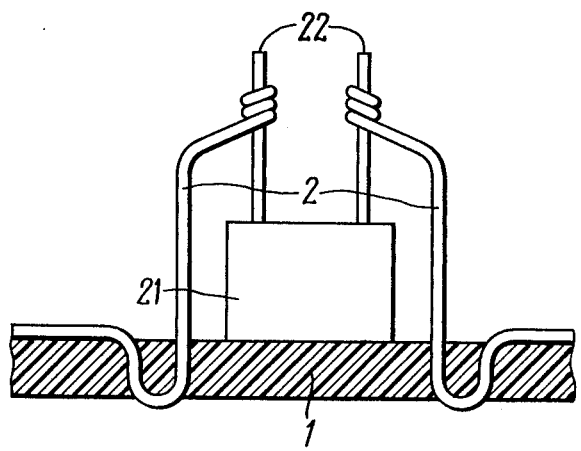
FIG. 4 is a sectional view of an electric woven switching matrix with a circuit element installed on and connected to it.

FIG. 4 shows a sectional view of the section 3 of the proposed matrix with a circuit element 21 installed on and connected to it, lead-outs 22 of the circuit element 21 being connected to the matrix terminals formed by the severed and bent conducting wires 2.

The proposed invention allows matrix fabrication expenditures to be reduced considerably and their cost to be decreased if one takes into account the fact that similar electric woven switching matrices may be used in complicated electrical and electronic devices incorporating a large number of circuit elements.

While the invention has been described herein in terms of the preferred embodiments, numerous variations may be made in the apparatus illustrated in the drawings and herein described without departing from the invention as set forth in the appended claims.

What is claimed is:

1. An electric woven switching matrix comprising:
    an insulating field fabric formed of a plurality of interwoven insulating fibers;
    a plurality of conducting wires arranged in sets with each set comprising two generally co-extensive conducting wires interwoven with said plurality of insulating fibers of said insulating field fabric;

a plurality of sections for installation of circuit elements over the area of the matrix, each of said sections including:

sets of said plurality of conducting wires which form, by severing, matrix terminals to be electrically connected with lead-outs of a circuit element to be installed in said section, said two conducting wires of each set of conducting wires extending out from said insulating field fabric at points disposed on one side of said section, extending over the surface of said insulating field fabric and extending back into said insulating field fabric at points disposed on an opposite side of said section, said exit points from said insulating field fabric and said entrance points into said insulating field fabric for the conducting wires of odd sets of conducting wires of said sets of conducting wires being staggered with respect to said exit points from said insulating field fabric and said entrance points into said insulating field fabric for the conducting wires of even sets of conducting wires of said sets of conducting wires to provide overlapping regions of said even and odd sets of conducting wires which are of substantially greater length than the spacing between adjacent sets of conducting wires.

2. An electric woven switching matrix comprising: an insulating field fabric formed of a plurality of interwoven insulating fibers;

a plurality of conducting wires interwoven with said plurality of insulating fibers of said insulating field fabric;

a plurality of sections for installation of circuit elements over the area of the matrix, each of said sections including:

sets of said plurality of conducting wires which form, by severing, matrix terminals to be electrically connected with lead-outs of a circuit element to be installed in said section, said sets of conducting wires extending out from said insulating field fabric at points disposed on one side of said section, extending over the surface of said insulating field fabric and extending back into said insulating field fabric at points disposed on an opposite side of said section, said exit points from said insulating field fabric and said entrance points into said insulating field fabric for odd sets of conducting wires of said sets of conducting wires being staggered with respect to said exit points from said insulating field fabric and said entrance points into said insulating field fabric for even sets of conducting wires of said sets of conducting wires to provide overlapping regions of said even and odd sets of conducting wires which are of substantially greater length than the spacing between adjacent sets of conducting wires.

* * * * *